United States Patent
Tsukamoto et al.

(10) Patent No.: US 9,066,564 B2
(45) Date of Patent: Jun. 30, 2015

(54) DECORATIVE ARTICLE AND TIMEPIECE

(71) Applicant: Seiko Epson Corporation, Tokyo (JP)

(72) Inventors: Yuzuru Tsukamoto, Higashichikuma-gun, Nagano (JP); Atsushi Kawakami, Matsumoto, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 31 days.

(21) Appl. No.: 13/960,080

(22) Filed: Aug. 6, 2013

(65) Prior Publication Data

US 2014/0044990 A1   Feb. 13, 2014

(30) Foreign Application Priority Data

Aug. 9, 2012  (JP) ................. 2012-177161

(51) Int. Cl.

| | |
|---|---|
| G04B 37/22 | (2006.01) |
| A44C 27/00 | (2006.01) |
| B32B 9/04 | (2006.01) |
| B32B 15/04 | (2006.01) |
| G04B 37/00 | (2006.01) |
| C23C 14/00 | (2006.01) |
| C23C 14/02 | (2006.01) |
| C23C 14/06 | (2006.01) |
| B22F 7/04 | (2006.01) |
| C23C 28/00 | (2006.01) |

(52) U.S. Cl.
CPC ....... *A44C 27/006* (2013.01); *Y10T 428/12812* (2015.01); *B32B 9/04* (2013.01); *B32B 15/04* (2013.01); *G04B 37/00* (2013.01); *C23C 14/0015* (2013.01); *C23C 14/024* (2013.01); *C23C 14/0664* (2013.01); *B22F 7/04* (2013.01); *C23C 28/321* (2013.01); *C23C 28/34* (2013.01); *G04B 37/22* (2013.01)

(58) Field of Classification Search
USPC .................................. 428/336, 469, 472, 698
See application file for complete search history.

(56) References Cited

U.S. PATENT DOCUMENTS 4,791,017 A * 12/1988 Hofmann et al. ............. 428/469
7,261,956 B2   8/2007 Kawakami et al.

FOREIGN PATENT DOCUMENTS

| JP | 3642426 B1 | | 4/2005 |
|---|---|---|---|
| JP | 2005-253893 | * | 9/2005 |
| WO | 2012/000401 | * | 1/2012 |

OTHER PUBLICATIONS

English translationf of JP 2005-253893.*

* cited by examiner

*Primary Examiner* — Archene Turner
(74) *Attorney, Agent, or Firm* — Global IP Counselors, LLP

(57) ABSTRACT

A decorative article comprises a substrate being primarily composed of at least any of Ti and stainless steel in at least part of a surface vicinity thereof; a first coat being formed on the substrate and being primarily composed of TiCN; a second coat being formed on a side of the first coat opposite a side facing the substrate and being composed of stainless steel; wherein a combined C content ratio and N content ratio in the first coat is equal to or more than 2.0 wt % and less than or equal to 19 wt %.

14 Claims, 5 Drawing Sheets

DECORATIVE ARTICLE AND TIMEPIECE

CROSS-REFERENCE TO RELATED APPLICATIONS

This application claims priority to Japanese Patent Application No. 2012-177161 filed on Aug. 9, 2012. The entire disclosure of Japanese Patent Application No. 2012-177161 is hereby incorporated herein by reference.

BACKGROUND

1. Technical Field

The present invention relates to a decorative article and a timepiece.

2. Background Technology

In the metal materials such as titanium material, stainless steel, or the like that are used for exterior components for timepiece, the hardness of these materials is low so that in the environment of use in the market, the aforementioned materials have had problems in that the surface is easily scratched and the aesthetic appearance is significantly degraded by long term use.

In order to resolve such problems, the present inventors have developed the surface treatment technology and it has been used in the market to prevent a surface from scratching (e.g., see Patent Document 1).

In the aforementioned Patent Document 1, TiCN as a cured coating was formed on the substrate composed of titanium or stainless steel so as to improve the hardness. In order to maintain luster aesthetics as a decorative article, titanium, platinum, palladium, indium, or the like was formed on the cured coating.

Japanese Patent No. 3642427 (Patent Document 1) is an example of the related art.

SUMMARY

Problems to be Solved by the Invention

However, platinum, palladium, and indium are expensive so that it was limited to use for a high-priced product. Also, the brightness of titanium is relatively low and the color is darker feel so that it was limited to use for timepiece components made by titanium that emphasize the lightness than the aesthetics.

An advantage of the invention is to provide a decorative article and a timepiece that enable to maintain excellent aesthetics over a longer period of time, with a reasonable price, and have moderate brightness.

Means Used to Solve the Above-Mentioned Problems

A decorative article of the invention includes a substrate being primarily composed of at least any of Ti and stainless steel in at least part of a surface vicinity thereof; a first coat being formed on the substrate and being primarily composed of TiCN; a second coat being formed on a side of the first coat opposite a side facing the substrate and being composed of stainless steel; wherein a combined C content ratio and N content ratio in the first coat is equal to or more than 2.0 wt % and less than or equal to 19 wt %.

According to the invention, the first coat is composed of TiCN, and the combined C content ratio and N content ratio is a value within the above mentioned range. Thus, it is possible to provide the decorative article with superior hardness, and to ensure that the decorative article is not susceptible to cuts, scratches, and other such indentations or the like. By the way, here, the hardness of the decorative article means the hardness in a surface side of the first coat or the second coat, and hereinafter, it refers to as "hardness of decorative article surface side". Also, the second coat is composed of stainless steel. It is thus possible to provide it in a reasonable price compared to the platinum, palladium, and indium. Also, the stainless steel has higher brightness compared to the titanium so that it is not limited to a target of use and it can be applied to the exterior components for timepiece which are required for excellent aesthetic appearance. In addition, the first coat is TiCN, in which the combined C content ratio and N content ratio is a value within the above described range, and the second coat is stainless steel. A color tone (chromaticity) of TiCN and a color tone (chromaticity) of stainless steel are relatively similar (difference is small) so that even if the stainless steel is rubbed or stripped off due to extensive use of the decorative article, adverse effects to the aesthetic appearance of the decorative article can be minimized. Because of this, the decorative article that enable to maintain excellent aesthetic appearance over a longer period of time, with a reasonable price, and has a moderate brightness, can be provided.

In the invention, it is preferable that the C content ratio in the first coat is equal to or more than 1 wt % and less than or equal to 10 wt %. According to this invention, if the C content ratio in the first coat is a value within the above described range, the hardness of decorative article surface side is sufficiently high and the color tone (chromaticity) of the first coat can be optimized. Therefore, it is possible to provide the decorative article with a particularly excellent aesthetic appearance and to maintain the excellent aesthetic appearance over a longer period of time.

In the invention, it is preferable that the N content ratio in the first coat is equal to or more than 0.5 wt % and less than or equal to 10 wt %. According to this invention, if the N content ratio in the first coat is a value within the above described range, the hardness of decorative article surface side is sufficiently high and the color tone (chromaticity) of the first coat can be optimized. Therefore, it is possible to provide the decorative article with a particularly excellent aesthetic appearance and to maintain the excellent aesthetic appearance over a longer period of time.

In the invention, it is preferable that the C content ratio in the first coat is higher than the N content ratio in the first coat. According to this invention, if the C content ratio in the first coat is higher than the N content ratio of the first coat, the color tone (chromaticity) of the first coat can be optimized so that it is possible to provide the decorative article with a particularly excellent aesthetic appearance.

In the invention, it is preferable that the average thickness of the first coat is equal to or more than 1.0 μm and less than or equal to 3.0 μm. According to this invention, the average thickness of the first coat is a value within the above described range so that the hardness of the first coat is sufficiently high, and it is possible to effectively prevent the internal stress in the first coat from increasing. Because of this, it possible to ensure that the decorative article is not susceptible to cuts, scratches, and other such indentations or the like, and it is possible to maintain excellent aesthetic appearance over a longer period of time.

In the invention, it is preferable that the average thickness of the second coat is equal to or more than 0.1 μm and less than or equal to 1.0 μm. According to this invention, the average thickness of the second coat is a value within the above described range so that the hardness of the decorative article is sufficiently high. It is possible to provide the decorative article with a particularly excellent aesthetic appearance and to maintain the excellent aesthetic appearance over a longer period of time.

In the invention, it is preferable that the first coat is formed by the vapor phase film forming method. According to this invention, forming the first coat by the vapor phase film forming method makes it possible to ensure that variation in the film thickness will be low so that the first coat is reliably formed with uniform thickness, and has particularly superior adhesiveness with the substrate. By the way, the phrase "adhesiveness with the substrate" means to include adhesiveness with the substrate through a foundation layer. As a result, it is possible to provide the decorative article with a particularly excellent aesthetic appearance and durability. This is also advantageous in terms of improving the reliability of the decorative article because unevenness in the film thickness can be sufficiently reduced even when the first coat to be formed is relatively thin.

In the invention, it is preferable that the vapor phase film forming method is ion plating. According to this invention, employing the ion plating among the vapor phase film forming methods makes it possible to ensure that variation in the film thickness will be low so that the first coat is reliably formed with uniform thickness, and has particularly superior adhesiveness with the substrate. As a result, it is possible to provide the decorative article with a particularly excellent aesthetic appearance and durability. This is also advantageous in terms of improving the reliability of the decorative article because unevenness in the film thickness can be sufficiently reduced even when the first coat to be formed is relatively thin.

In the invention, it is preferable that the second coat is formed by sputtering. According to this invention, the second coat is formed by sputtering so that the adhesiveness of the second coat can be excellent. Also, unevenness of the film thickness is small even when the film thickness of the second coat is relatively thin. In addition, the uniform second coat can be easily formed. Therefore, it is possible to provide the decorative article with a particularly excellent aesthetic appearance and to maintain the excellent aesthetic appearance over a longer period of time.

In the invention, it is preferable that at least one foundation layer is formed between the substrate and the first coat. According to this invention, a foundation layer is formed between the substrate and the first coat so that for example, the adhesiveness between the substrate and the first coat can be improved. It is possible that the decorative article has superior reliability and durability.

In the invention, it is preferable that the foundation layer is primarily composed of Ti. According to this invention, the foundation layer is primarily composed of Ti so that for example, the adhesiveness between the substrate and the first coat can be improved. It is possible that the decorative article has superior reliability and durability.

In the invention, it is preferable that the average thickness of the foundation layer is equal to or more than 0.1 μm and less than or equal to 2.0 μm. According to this invention, if the average thickness of the foundation layer is a value within the above described range, for example, it is possible to prevent sufficiently the internal stress in the foundation layer from increasing and cracks, or the like from occurring. Thus, it is possible to effectively perform the functions of the foundation layer.

In the invention, in the surface side that the second coat is provided, it is preferable that the Vickers hardness Hv measured at a load of 10 gf is equal to or more than 600 and less than or equal to 1000. According to this invention, the Vickers hardness Hv is a value within the above described range in the surface side that the second coat is provided. Thus, it is possible to maintain excellent aesthetic appearance as a decorative article over a longer period of time.

In the invention, the decorative article is preferably an exterior component for a timepiece. Exterior components for timepieces are commonly decorative articles that are susceptible to impact from external sources, and these components must have an aesthetic appearance as a decorative article, and durability as a practical article. According to the invention, these requirements can be simultaneously satisfied.

The timepiece of the invention includes any of the aforementioned decorative articles. According to the invention, a timepiece that enables to maintain excellent aesthetic appearance over a longer period of time can be provided.

BRIEF DESCRIPTION OF THE DRAWINGS

Referring now to the attached drawings which form a part of this original disclosure:

FIG. 2A shows an illustration of a substrate; FIG. 2B shows an illustration forming the first coat in the first process; and FIG. 2C shows an illustration forming the second coat in the second process;

FIG. 4A shows an illustration of a substrate; FIG. 4B shows an illustration forming a foundation layer in a foundation forming process; and FIG. 4C shows an illustration forming the first coat in the first process; and FIG. 4D shows an illustration forming the second coat in the second process.

DETAILED DESCRIPTION OF EXEMPLARY EMBODIMENTS

First Embodiment

The following descriptions in respective embodiments disclose a preferred specific example of the invention. Thus, the preferred technological various limitations are made but unless the following descriptions particularly limit the invention, the scope of the invention is not limited to these embodiments.

Figure 1:
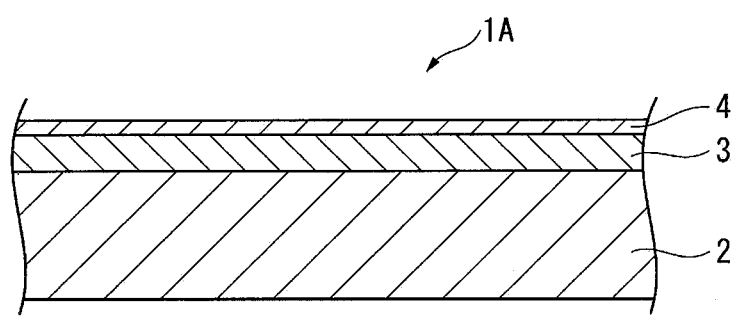
FIG. 1 is a cross-sectional view showing a decorative article of the first embodiment of the invention.

First, the first embodiment of the decorative article of the invention and the preferred embodiment of the manufacturing method thereof will be described. FIG. 1 is a cross-sectional view showing a decorative article 1A of the first embodiment of the invention. As shown in FIG. 1, the decorative article 1A is provided with a substrate 2, the first coat 3, and the second coat.

Configuration of Substrate

In the substrate, at least a part of the surface vicinity is primarily composed of at least any of Ti and stainless steel. As a material primarily composed of Ti, for example, it includes Ti (Ti as an elementary substance), Ti alloy, or the like. Also, as a stainless steel, for example, it includes Fe—Cr based alloy, Fe—Cr—Ni based alloy, or the like, and more specifically, SUS 405, SUS 430, SUS 434, SUS 444, SUS 429, SUS 430F and the like, as well as SUS 304, SUS 303, SUS 316, SUS 316 L, SUS 316 J1, SUS 316 J1L, and the like. By the way, if the material primarily composed of at least any of Ti and stainless steel is not used, it will be difficult to maintain excellent aesthetic appearance in the decorative article, specifically the decorative article of exterior components for timepiece, for sufficient long period of term.

Also, the substrate 2 can be a substantially uniform composition in every section, and can also have a composition that differs from section to section. For example, the substrate 2 can have a base, and a surface layer formed on top of the substrate. When the substrate 2 has such a configuration, the degree of freedom in molding the substrate 2 can be increased depending, for example, on the selection of the constituent material for the substrate, and a decorative article 1A with a more complicated shape can be relatively easily manufactured. If the substrate 2 has a base and a surface layer, the thickness of the surface layer (average value) is not particularly limited, but is preferably equal to or more than 0.1 μm and less than or equal to 50 μm, and is more preferably equal to or more than 1.0 μm and less than or equal to 10 μm. If the thickness of the surface layer is a value within this range, the substrate 2 can be provided with particularly excellent strength after undergoing a hardening treatment, and the surface layer can be more reliably prevented from accidentally peeling off of the substrate.

When the substrate 2 has a base and a surface layer, the materials primarily composed of at least any of Ti and stainless steel previously described, for example, can be suitably used as the constituent materials of the surface layer. Metal materials, nonmetal materials, and the like, for example, can be used as the constituent materials of the substrate. When the substrate is composed of a metal material, it is possible to provide a decorative article 1A having particularly excellent strength characteristics.

In addition, when the substrate is composed of a metal material, the surface roughness of the resulting decorative article 1A can be reduced due to the leveling effects when the surface layer, the first coat 3 and the second coat 4 described later are formed, when the surface roughness of the substrate is relatively high. For example, it is possible to provide a mirror finish even if machining based on cutting, polishing, or the like and performed on the surface of the substrate is omitted. Since the substrate is molded by MIM methods, a mirror finish can be easily created even when the surface has a satin finish. Thus, a decorative article with excellent luster can be provided.

When the substrate is composed of, for example, a nonmetal material, a decorative article 1A can be provided that is relatively lightweight and easily portable and that has a substantive appearance. In addition, when the substrate is composed of, for example, a nonmetal material, it can be formed into the desired shape relatively easily. Furthermore, when the substrate is composed of a nonmetal material, the effects of blocking electromagnetic noise are realized.

For example, as a metal material constituting the substrate, it includes various metals of Fe, Cu, Zn, Ni, Ti, Mg, Cr, Mn, Mo, Nb, Al, V, Zr, Sn, Au, Pd, Pt, Ag, or the like, and also, it includes alloys, or the like containing at least one of these metals. Of these examples, Cu, Zn, Ni, Ti, Al, or an alloy containing at least one of these metals are preferred. Configuring the substrate with such materials makes it possible to ensure particularly superior adhesiveness between the substrate and the surface layer, improves the workability of the substrate, and further increases the degree of freedom in molding the entire substrate 2.

Further, for example, as a nonmetal material constituting the substrate, it includes ceramics, plastic (particularly heat-resistant plastic), stone, wood, and the like. For example, as ceramics, it includes oxide-based ceramics such as $Al_2O_3$, $SiO_2$, $TiO_2$, $Ti_2O_3$, $ZrO_2$, $Y_2O_3$, barium titanate, strontium titanate, or the like; nitride-based ceramics such as AlN, $Si_3N_4$, SiN, TiN, BN, ZrN, HfN, VN, TaN, NbN, CrN, $Cr_2N$, or the like; carbide-based ceramics such as graphite, SiC, ZrC, $Al_4C_3$, $CaC_2$, WC, TiC, HfC, VC, TaC, NbC, or the like; boride-based ceramics such as $ZrB_2$, MoB, or the like; and compound ceramics made of a combination of two or more of these examples. When the substrate is composed of such ceramics, a decorative article 1A having particularly superior strength and hardness can be obtained.

For example, as a plastic material constituting the substrate, it includes various thermoplastic resins and various thermo-setting resins. For example, it includes polyethylene, polypropylene, ethylene-propylene copolymers, ethylene-vinyl acetate copolymers (EVA), other polyolefins, cyclic polyolefins, modified polyolefins, polyvinyl chloride, polyvinylidene chloride, polystyrene, polyamide (examples: nylon 6, nylon 46, nylon 66, nylon 610, nylon 612, nylon 11, nylon 12, nylon 6-12, nylon 6-66), polyimide, polyamide imide, polycarbonate (PC), poly(4-methylbentene-1), ionomers, acrylic resins, polymethyl methacrylate, acrylonitrile-butadiene-styrene copolymers (ABS resins), acrylonitrile-styrene copolymers (AS resins), butadiene-styrene copolymers, polyoxymethylene, polyvinyl alcohols (PVA), ethylene-vinyl alcohol copolymers (EVOH), polyethylene terephthalate (PET), polybutylene terephthalate (PBT), polycyclohexane terephthalate (PCT), other polyesters, polyether, polyether ketone (PEK), polyether ether ketone (PEEK), polyether imide, polyacetal (POM), polyphenylene oxide, modified polyphenylene oxide, polysulfone, polyether sulfone, polyphenylene sulfide, polyarylate, aromatic polyesters (liquid crystal polymers), polytetrafluoroethylene, polyvinylidene fluoride, other fluororesins, and various thermoplastic elastomers based on styrene, polyolefin, polyvinyl chloride, polyurethane, polyester, polyamide, polybutadiene, transpolyisoprene, fluoride rubber, polyethylene chloride, or the like, as well as epoxy resins, phenol resins, urea resins, melamine resins, unsaturated polyesters, silicone-based resins, urethane-based resins, poly-para-xylylene, poly-monochloro-para-xylylene, poly-dichloro-para-xylylene, poly-monofluoro-para-xylylene, poly-monoethyl-para-xylylene, and other such poly-para-xylylene resins. Additional examples include copolymers, blends, and polymer alloys primarily made of these; and combinations (for example, blended resins, polymer alloys, layered products, and the like) of one or two or more of these examples can be used. Further, the shape and size of the substrate 2 are not particularly limited, and are normally determined based on the shape and size of the decorative article 1A.

Configuration of First Coat

The first coat 3 is formed on the surface of the substrate 2. The first coat 3 is primarily composed of TiCN. The combined C content ratio and N content ratio in the first coat 3 is preferably equal to or more than 2.0 wt % and less than or equal to 19 wt %. The remaining portions in the first coat 3 are Ti. The presence of the first coat 3 makes it possible to provide the decorative article 1A surface side with superior hardness, and to ensure that the decorative article 1A is not susceptible to cuts, scratches, and other such indentations or the like. Further, the presence of the first coat 3 makes it possible to provide the entire decorative article 1A with a superior aesthetic appearance even when the film thickness of the second coat 4 described later is relatively low. Specifically, the color tone of the first coat 3 has a strong effect on the aesthetic appearance of the decorative article 1A when the film thickness of the second coat 4 described later is relatively thin. However, since the color tone (chromaticity) of the TiCN (first coat 3) described above is relatively similar to the color tone (chromaticity) of the second coat 4 (the difference is small), the entire decorative article 1A can be provided with a superior aesthetic appearance. In addition, the adverse effects on the aesthetic appearance of the decorative article 1A can be minimized even when the second coat 4 is rubbed or stripped off due to extensive use of the decorative article 1A, for example. On the other hand, the hardness of the entire decorative article cannot be sufficiently increased when the decorative article does not have a first coat composed of TiCN. As a result, the decorative article is susceptible to cuts, scratches, and other such indentations or the like. Further, the effect of the color tone of the substrate and the like on the appearance of the decorative article increases when the decorative article does not have a first coat composed of TiCN. Therefore, sometimes the aesthetic appearance of the decorative article is significantly compromised, depending on the combination of the constituent material of the substrate, the constituent material of the second coat, and the like. Moreover, the hardness of the entire decorative article cannot be sufficiently increased when the combined C content ratio and N content ratio in the first coat is less than the aforementioned lower limit. As a result, the decorative article is susceptible to cuts, scratches, and other such indentations or the like. Also, when the combined C content ratio and N content ratio in the first coat exceeds the aforementioned upper limit, the internal stress of the coating film becomes too great and cracks and the like are likely to occur, depending on the thickness and the like of the first coat. Therefore, the reliability of the decorative article is significantly reduced. Furthermore, when the combined C content ratio and N content ratio in the first coat exceeds the aforementioned upper limit, the difference in color tone (chromaticity) with the second coat becomes too great and the aesthetic appearance of the entire decorative article is reduced.

As described above, the sum ($X_1$) of the C content ($X_{1C}$) and the N content ($X_{1N}$) in the first coat 3 is equal to or more than 2.0 wt % and less than or equal to 19 wt %, but equal to or more than 2.5 wt % and less than or equal to 18 wt % is preferable, and equal to or more than 3.0 wt % and less than or equal to 17 wt % is even more preferable. Thus, in the invention, the combined C content ratio and N content ratio in the first coat is preferably relatively low. Because of this, the effects previously described are thereby more pronounced.

Furthermore, the C content ratio ($X_{1C}$) in the first coat 3 is preferably equal to or more than 1 wt % and less than or equal to 10 wt %, and is more preferably equal to or more than 1.5 wt % and less than or equal to 9 wt %. If the C content ratio in the first coat 3 is a value within this range, the decorative article 1A surface side is ensured to have sufficient hardness, and the color tone (chromaticity) of the first coat 3 can be optimized. As a result, the above-described effects of the invention are more significantly performed. On the other hand, if the C content ratio in the first coat 3 is less than the aforementioned lower limit, it can be difficult to ensure a sufficient hardness for the decorative article 1A surface side, depending on the N content ratio and the like in the first coat 3. If the C content ratio in the first coat 3 exceeds the aforementioned upper limit, the color tone of the first coat 3 becomes too strong (too black), which can possibly have adverse effects on the aesthetic appearance of the decorative article 1A, depending on the thickness and the like of the second coat 4.

In addition, the N content ratio ($X_{1N}$) in the first coat 3 is preferably equal to or more than 0.5 wt % and less than or equal to 10 wt %, and is more preferably 1.0 wt % and less than or equal to 8 wt %. If the N content ratio in the first coat 3 is a value within this range, the decorative article 1A surface side is ensured to have sufficient hardness, and the color tone (chromaticity) of the first coat 3 can be optimized. As a result, the above-described effects of the invention are more significantly exhibited.

On the other hand, if the N content ratio in the first coat 3 is less than the aforementioned lower limit, it can be difficult to ensure sufficient hardness for the decorative article 1A surface side, depending on the C content ratio and the like in the first coat 3. If the N content ratio in the first coat 3 exceeds the aforementioned upper limit, the color tone of the first coat 3 becomes too strong (too gold), which can possibly have adverse effects on the aesthetic appearance of the decorative article 1A, depending on the thickness and the like of the second coat 4.

Further, the C content ratio $X_{1C}$ (wt %) in the first coat 3 is preferably higher than the N content ratio $X_{1N}$ (wt %) in the first coat 3. Because of this, the color tone (chromaticity) of the first coat 3 can be optimized so that the decorative article 1A can be provided with a particularly excellent aesthetic appearance.

Further, the C content ratio $X_{1C}$ (wt %) in the first coat 3 and the N content ratio $X_{1N}$ (wt %) in the first coat 3 preferably satisfy the relationship $0.5 \leq X_{1C} - X_{1N} \leq 9$, and more preferably satisfy the relationship $1 \leq X_{1C} - X_{1N} \leq 8$, and even more preferably satisfy the relationship $2 \leq X_{1C} - X_{1N} \leq 7$. If such a relationship is satisfied, the color tone of the first coat 3 can thereby be prevented from becoming too black, and the decorative article 1A surface side can be ensured to have a sufficient hardness. As a result, excellent aesthetic appearance can be maintained in the decorative article 1A over a longer period of time.

As described above, in the invention, the first coat is primarily composed of TiCN. TiC and TiN are both materials whose hardness is similar to that of TiCN. However, the effects of the invention cannot be realized when the first coat is composed of TiC or TiN. Specifically, when the first coat is composed of TiC, the color tone of the first coat becomes too black, and the aesthetic appearance of the entire decorative article is significantly compromised. Also, if the C content ratio in the first coat (TiC coat) is reduced to prevent this, a sufficient hardness cannot be ensured for the surface side of the decorative article, and the decorative article is susceptible to cuts, scratches, and other such indentations and the like. Similarly, when the first coat is composed of TiN, the color tone of the first coat becomes too gold, and the aesthetic appearance of the entire decorative article is compromised. Further, if the N content ratio in the first coat (TiN coat) is reduced to prevent this adverse event from occurring, a sufficient hardness cannot be ensured for the surface side of the decorative article, and the decorative article is susceptible to cuts, scratches, and other such indentations and the like.

If the first coat 3 is composed of TiCN as described above, the decorative article 1A is sufficiently stable under normal usage conditions, and the substrate 2 does not suffer substantial scratches, and the first coat 3 can be easily and reliably removed by using special reagents. By the way, as the normal usage conditions, for example, it can be a temperature of −50 to 120 C.° and a humidity of 0 to 100% RH. Therefore, when stains occur in the first coat 3 of the decorative article 1A, the first coat 3 can be removed and another first coat 3 can be suitably formed. Thus, in the decorative article of the invention, the coat (first coat) can be easily and reliably stripped and re-formed by using special reagents, and the characteristics thereof can therefore continue to be exhibited over an extremely long period of time. For example, a stripping agent that can be used to strip the first coat 3 is a solution or the like containing nitric acid ($HNO_3$) and sulfuric acid ($H_2SO_4$). When the stripping agent is such a solution, the concentration of nitric acid ($HNO_3$) in the solution is preferably about 10 to 30 vol %, and the concentration of sulfuric acid ($H_2SO_4$) is preferably about 10 to 30 vol %. Thus, the first coat 3 can be easily and reliably removed in a relatively short period of time without inflicting substantial damage to the substrate 2 or the like. On the other hand, it is difficult or practically impossible to strip the coat with a coat composed of TiN or TiC or a TiCN coat in which the combined C content ratio and N content ratio is outside of the aforementioned range, even with the use of such reagents as described above.

Further, the average thickness of the first coat 3 is not particularly limited, but is preferably equal to or more than 1.0 μm and less than or equal to 3.0 μm, and is more preferably equal to or more than 1.0 μm and less than or equal to 2.5 μm. If the average thickness of the first coat 3 is a value within this range, the first coat 3 can be ensured to have a sufficient hardness and the internal stress of the first coat 3 can be more effectively prevented from increasing. As a result, the decorative article 1A can be ensured to have particularly superior reliability and durability. On the other hand, if the average thickness of the first coat 3 is less than the aforementioned lower limit, the functions of the first coat 3 as described above can possibly not be sufficiently performed, depending on the C content ratio ($X_{1C}$), N content ratio ($X_{1N}$), and the like in the first coat 3. Also, if the average thickness of the first coat 3 exceeds the aforementioned upper limit, the internal stress of the first coat 3 exhibits a tendency to increase, depending on the C content ratio ($X_{1C}$), the N content ratio ($X_{1N}$), and the like in the first coat 3.

Furthermore, the first coat 3 can have a plurality of sections where the values for the combined C content ratio and N content ratio (or the values for the C content ratio and the values for the N content ratio) differ. For example, the first coat 3 can have a first section in which the combined C content ratio and N content ratio is a specific value X, and a second section in which the combined C content ratio and N content ratio is a specific value X' that is greater than X. In such a case, for example, providing the first section nearer to the substrate 2 than the second section makes it possible to further increase the hardness of the first coat 3 while more effectively preventing the internal stress of the first coat 3 from increasing, and to ensure particularly superior adhesiveness between the substrate 2 and the first coat 3. Therefore, it is possible for the decorative article 1A to maintain an excellent aesthetic appearance in a stable manner over a longer period of time. Moreover, the following effects are achieved when the second section is provided nearer to the substrate 2 than the first section. As a result of having a second section in which the combined C content ratio and N content ratio is relatively large, the entire first coat 3 can be ensured to have particularly superior hardness (hardness of the decorative article 1A surface side), and it is possible to reduce the effects of the second section having a relatively strong color tone on the aesthetic appearance of the decorative article 1A. Specifically, having the first section nearer to the second coat 4 (the external surface of the decorative article) than the second section makes the design of the decorative article 1A more susceptible to the effects of the color tone of the first section than the effects of the color tone of the second section. Therefore, the entire first coat 3 can be ensured to have a particularly superior hardness (hardness of the decorative article 1A surface side), and the entire decorative article 1A can be ensured to have a particularly excellent aesthetic appearance. Accordingly, it is possible for the decorative article 1A to maintain an excellent aesthetic appearance in a stable manner over a longer period of time. Furthermore, when the first coat 3 has a plurality of sections with different compositions (for example, when it has a first section and second section as described above), the first coat 3 can, for example, be configured with a layered structure including a plurality of layers with different compositions, or the composition can be changed with a gradient along the thickness direction.

Configuration of Second Coat

The second coat 4 composed of stainless steel is provided in a surface side opposed to the surface facing the first coat 3 of the substrate.

As a result of having such a second coat 4, the entire decorative article 1A has an excellent appearance, and particularly has a sophisticated white or silver color tone. The color tone of the above described first coat 3 is relatively similar to the color tone of the second coat 4, but without the second coat 4, the aesthetic appearance of the entire decorative article 1A is insufficient. More specifically, the decorative article 1A lacks sophistication without the second coat 4. As the second coat 4 composed of stainless steel, for example, it includes Fe—Cr based alloy, Fe—Cr—Ni based alloy, or the like, and more specifically, SUS 405, SUS 430, SUS 434, SUS 444, SUS 429, SUS 430F and the like, as well as SUS 304, SUS 303, SUS 316, SUS 316 L, SUS 316 J1, SUS 316 J1L, and the like. Among them, SUS316 L is particularly preferable.

The average thickness of the second coat 4 is not particularly limited, but is preferably equal to or more than 0.1 μm and less than or equal to 1.0 μm, and is more preferably equal to or more than 0.15 and less than or equal to 0.5 μm. If the average thickness of the second coat 4 is a value within this range, the entire decorative article 1A can be provided with a particularly excellent aesthetic appearance, and the decorative article 1A surface side can be ensured to have a particularly high hardness. As a result, it is possible for the decorative article 1A to maintain an excellent aesthetic appearance in a stable manner over a longer period of time. On the other hand, if the average thickness of the second coat 4 is less than the aforementioned lower limit, it can possibly be difficult to sufficiently ensure an excellent appearance for the decorative article 1A, depending on the composition and the like of the first coat 3 (for example, the C content ratio and N content ratio). Further, if the average thickness of the second coat 4 exceeds the aforementioned upper limit, it is difficult for the effects of having the first coat previously described to be sufficiently manifest, and the hardness of the decorative article 1A surface side exhibits a tendency to decrease.

Configuration of Decorative Article

The decorative article 1A described above can be any product that has decorative properties, and possible examples of items to which it can be applied include interior and exterior accessories for ornaments and the like, jewelry, timepiece cases (main bodies, back covers, and one-piece cases with the main body and back cover integrated), timepiece bands (including band buckles, band/bangle detachable mechanisms, and the like), dial plates, timepiece pointers, bezels (for example, rotating bezels and the like), winders (for example, screw-lock winders and the like), buttons, cover glass, glass rims, dial rings, see-through plates, gaskets, and other such external timepiece components; substrate plates for movements, gears, train wheel bridges, oscillating weights, and other such internal timepiece components; and eyeglasses (for example, eyeglass frames), necktie pins, cuff links, rings, necklaces, bracelets, anklets, brooches, pendants, earrings, pierced earrings, and other such personal accessories, as well as lighters and cases thereof, wheels for automobiles, golf clubs and other such sports equipment, nameplates, panels, trophies, various machinery accessories including other housings and the like, and various containers. Among these examples, external timepiece components are the most preferred. External timepiece components require aestheticism in design as decorative articles, and also require durability, corrosion resistance, scratching resistance, abrasion resistance, and a superior design as practical articles, but all these requirements can be met according to the invention. The term "external timepiece components" in the present specification can denote any components that are visible from the outside, but is not limited to those exposed on the exterior of the timepiece and includes those installed in the interior of the timepiece. Further, in the decorative article Al, the Vickers hardness Hv measured at a load of 10 gf is preferably equal to or more than 600 and less than or equal to 1000 in the surface side on which the second coat is provided. It is thereby possible to maintain an excellent aesthetic appearance in the decorative article over a longer period of time.

Manufacturing Method of Decorative Article

Figure 2A:
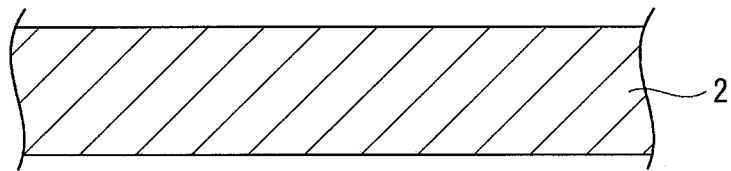
FIGS. 2A-2C are cross-sectional views showing a method for manufacturing the decorative article shown in FIG. 1 in a preferred embodiment.
Figure 2B:
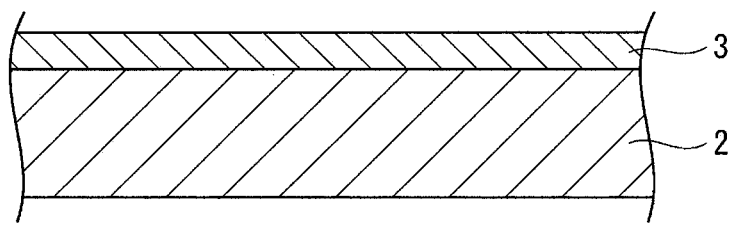
Figure 2C:
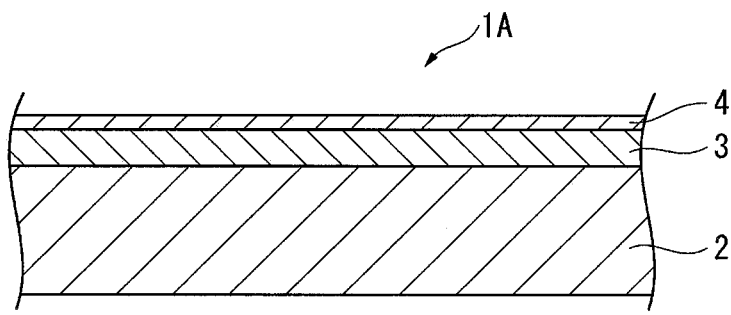

Next, the method for manufacturing the decorative article 1A described above will be described. FIGS. 2A-2C are cross-sectional views showing a method for manufacturing the decorative article shown in FIG. 1 in the preferred embodiment. The method for manufacturing the decorative article of the present embodiment has a first step (FIG. 2B) of forming the first coat 3 on at least part of the surface of the substrate 2 (FIG. 2A), and a second step (FIG. 2C) of forming the second coat 4 on at least part of the surface of the first coat 3.

Manufacturing of Substrate

The components previously described can be used for the substrate 2. Also, the substrate 2 can be molded by any suitable method, but possible examples of methods for molding the substrate 2 include pressing, cutting, forging, casting, metal powder sintering, metal powder injection molding (MIM), lost-wax processing, and the like.

When the substrate 2 has a base portion and a surface layer as previously described, the substrate 2 can be manufactured as follows. Specifically, the substrate 2 can be obtained by forming a surface layer on the substrate portion manufactured by a method such as one previously described. Possible examples of the method for forming the surface layer include: dipping, paint coating, spray coating, electrostatic coating, electrodeposition coating, and other such coating methods; electrolytic plating, immersion plating, electroless plating, and other such wet plating methods; heat CVD, plasma CVD, laser CVD, and other such chemical vapor deposition methods (CVD); vacuum deposition, sputtering, ion plating, and other such dry plating methods; thermal spraying; and the like.

Further, the surface of the substrate 2 can be mirror finished, crease processed, satin processed, or otherwise surface treated. It is thereby possible to have variation in the glossy appearance in the surface of the resulting decorative article 1A, and the decorative properties of the resulting decorative article 1A can be further improved. Mirror finishing, for example, can be performed using conventional polishing methods, for which buffer (cloth) polishing, barrel polishing, and other mechanical polishing methods can be employed.

A decorative article 1A manufactured with the use of a substrate 2 subjected to such surface treatment is less flashy and has a particularly excellent aesthetic appearance compared to one obtained by directly subjecting the first coat 3 and second coat 4 to the aforementioned surface processing. Further, since the first coat 3 is composed of the hard material of TiCN as previously described, when the first coat 3 is directly subjected to surface processing, the first coat 3 is susceptible to cracks and other such blemishes when undergoing the surface processing, and the yield rate of manufacturing the decorative article 1A can significantly decrease, but subjecting the substrate 2 to surface treatment makes it possible to prevent effectively such problems. Moreover, the surface treatment for the substrate 2 can be more easily performed under mild conditions than the surface processing for the first coat 3. In addition, since the second coat 4 normally has a relatively low thickness, when the surface processing described above is performed after the second coat 4 is formed, the film thickness of the second coat in the subjected areas is markedly reduced, and the first coat can possibly be exposed. In such a case, the aesthetic appearance of the decorative article 1A is severely compromised as a result.

First Step (First Coat Formation Step)

A first coat 3 composed of TiCN is formed on the surface of the substrate 2 (FIG. 2B). The method for forming the first coat 3 is not particularly limited, and possible examples include: spin coating, dipping, paint coating, spray coating, electrostatic coating, electrodeposition coating, and other such coating methods; electrolytic plating, immersion plating, electroless plating, and other such wet plating methods; heat CVD, plasma CVD, laser CVD, and other such chemical vapor deposition methods (CVD); vacuum deposition, sputtering, ion plating, and other such dry plating methods (vapor phase film forming methods); and thermal spraying, and the like. However, a dry plating method (vapor phase film forming method) is preferred. Applying a dry plating method (vapor phase film forming method) as the method for forming the first coat 3 makes it possible to form reliably a first coat 3 that has uniform thickness, is homogeneous, and has particularly superior adhesiveness with the substrate 2. As a result, the finally resulting decorative article 1A can be ensured to have a particularly excellent aesthetic appearance and durability. Applying a dry plating method (vapor phase film forming method) as the method for forming the first coat 3 also makes it possible to ensure that variation in the film thickness will be sufficiently low even if the first coat 3 to be formed is relatively thin. This is advantageous in terms of improving the reliability of the decorative article 1A. Applying a dry plating method (vapor phase film forming method) as the method for forming the first coat 3 also makes it possible to control more reliably the C content ratio and N content ratio in the first coat 3.

Among the dry plating methods (vapor phase film forming methods) described above, ion plating is particularly preferred. If ion plating is applied as the method for forming the first coat 3, the desired effects described above are more pronounced as a result. Specifically, applying ion plating as the method for forming the first coat 3 makes it possible to form more reliably a first coat 3 that has uniform thickness, is homogeneous, and has particularly superior adhesiveness with the substrate 2. As a result, the finally resulting decorative article 1A can be ensured to have a more excellent aesthetic appearance and durability. Applying ion plating as the method for forming the first coat 3 also makes it possible to ensure that variation in the film thickness will be sufficiently low even if the first coat 3 to be formed is relatively thin. Applying ion plating as the method for forming the first coat 3 also makes it possible to control more reliably the C content ratio and N content ratio in the first coat 3.

When a dry plating method such as those described above is applied, for example, the first coat 3 can be easily and reliably formed by using Ti as a target and treating the film in an atmosphere containing C (carbon) and N (nitrogen). A mixed gas containing nitrogen gas ($N_2$ gas) and acetylene or another such hydrocarbon gas, for example, can be used as the atmospheric gas. The composition (C content ratio and N content ratio) and the like of the first coat 3 to be formed can be adjusted by suitably adjusting the blend ratio and the like of these gases.

The atmospheric gas can contain argon gas or another such inert gas, for example. Thus, the C content ratio and N content ratio in the first coat 3 can be easily and reliably controlled to be relatively low. The atmospheric gas can also contain oxygen gas ($O_2$) or the like, for example. Thus, a first coat 3 whose composition contains oxygen (TiCNO) can be easily and reliably formed.

Second Step (Second Coat Forming Step)

Next, the second coat 4 is formed on the surface of the first coat 3 formed as described above (FIG. 2 C). The method for forming the second coat 4 is not particularly limited, and possible examples include: spin coating, dipping, paint coating, spray coating, electrostatic coating, electrodeposition coating, and other such coating methods; electrolytic plating, immersion plating, electroless plating, and other such wet plating methods; heat CVD, plasma CVD, laser CVD, and other such chemical vapor deposition methods (CVD); vacuum deposition, sputtering, ion plating, and other such dry plating methods (vapor phase film forming methods); and thermal spraying, and the like, but a dry plating method (vapor phase film forming method) is preferred. Applying a dry plating method (vapor phase film forming method) as the method for forming the second coat 4 makes it possible to form reliably a second coat 4 that has uniform thickness, is homogeneous, and has particularly superior adhesiveness with the first coat 3. As a result, the finally resulting decorative article 1A can be ensured to have a particularly excellent aesthetic appearance and durability. Applying a dry plating method (vapor phase film forming method) as the method for forming the second coat 4 also makes it possible to ensure that variation in the film thickness will be sufficiently low even if the second coat 4 to be formed is relatively thin. This is advantageous in terms of improving the reliability of the decorative article 1A.

Among the dry plating methods (vapor phase film forming methods) described above, sputtering is particularly preferred. If sputtering is applied as the method for forming the second coat 4, the effects described above are more pronounced as a result. Specifically, applying sputtering as the method for forming the second coat 4 makes it possible to form more reliably a second coat 4 that has uniform thickness, is homogeneous, and has particularly superior adhesiveness with the first coat 3. As a result, the finally resulting decorative article 1A can be ensured to have a more excellent aesthetic appearance and durability. Applying sputtering as the method for forming the second coat 4 also makes it possible to ensure that variation in the film thickness will be sufficiently low even if the second coat 4 to be formed is relatively thin, which is advantageous in terms of improving the reliability of the decorative article 1A.

Configuration of Timepiece

Figure 5:
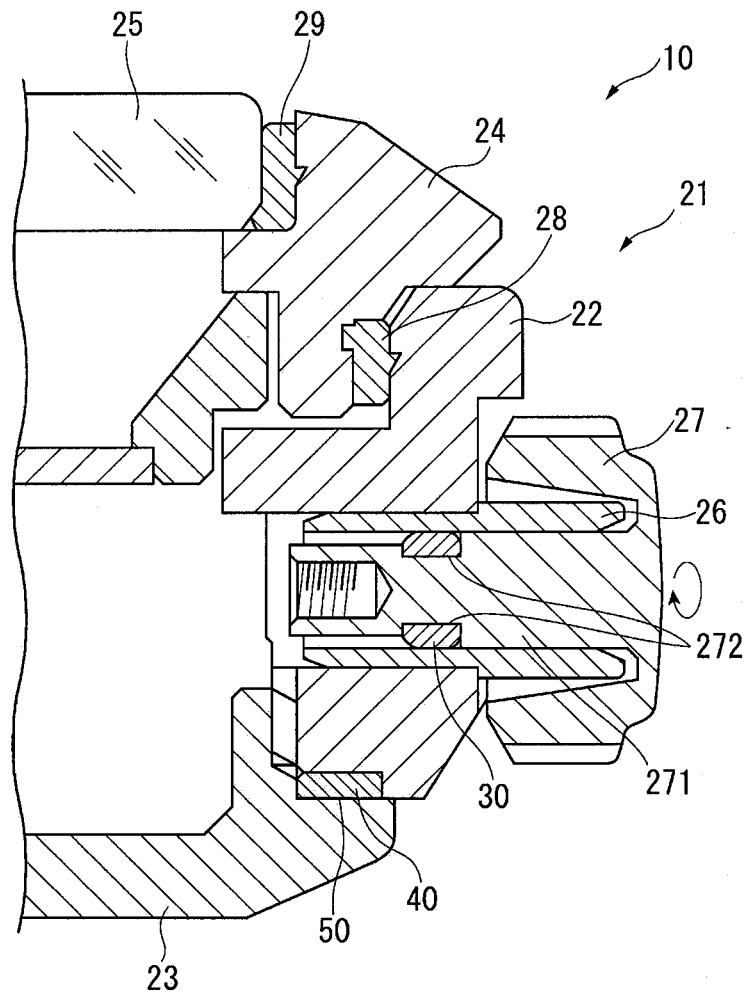
FIG. 5 is a partial cross-sectional view showing a timepiece (portable timepiece) of the invention in a preferred embodiment.

Next, the timepiece of the invention provided with the decorative article of the invention as described above will be explained. FIG. 5 is a partial cross-sectional view showing a timepiece (portable timepiece) of the invention of the preferred embodiment. As shown in FIG. 5, a wristwatch (portable timepiece) 10 of the present embodiment is provided with an exterior case 21. The exterior case 21 is provided with a cylindrical case body 22, a back cover 23 fixed on the back surface side of the case body 22, a ring-shaped bezel (edge) 24 fixed on the front surface side of the case body 22, and a glass plate 25 held onto the bezel 24. Also, a movement (for example, a dial plate to which pointers are attached) not shown in the drawing is housed in, the case 22.

A stem pipe 26 is fitted and fixed in place in the case body 22, and an axle 271 of a crown 27 is rotatably inserted into the stem pipe 26. The case body 22 and the bezel 24 are fixed to each other with a plastic gasket 28, and the bezel 24 and glass plate 25 are fixed to each other with a plastic gasket 29. Also, the back cover 23 is fitted (or screwed) onto the case body 22. Further, a ring-shaped rubber gasket (back cover gasket) 40 is inserted through a connecting part (seal part) 50 of the back cover 23 in a compressed state. The seal part 50 is sealed in a watertight manner due to this configuration, achieving a waterproof function.

A groove 272 is formed in the outer circumference in the middle of the axle 271 of the crown 27, and a ring-shaped rubber gasket (crown gasket) 30 is fitted into the groove 272. The rubber gasket 30 is bonded to the inner peripheral surface of the stem pipe 26, and the space between the inner peripheral surface thereof and the inner peripheral surface of the groove 272 is compressed. The space between the crown 27 and the stem pipe 26 is sealed in a watertight manner due to this configuration, achieving a waterproof function. When the crown 27 is rotatably operated, the rubber gasket 30 rotates with the axle 271 and oscillates in the circumferential direction while remaining bonded to the inner peripheral surface of the stem pipe 26. In the wristwatch 10 of the invention, at least one decorative article (particularly an external component for a timepiece) from among the case body 22, the back cover 23, the bezel 24, the crown 27, the timepiece band, and the like is configured from the decorative article as previously described.

Functional Effect of First Embodiment

According to the decorative article of the first embodiment, the following functional effects can be achieved.

(1) The first coat 3 is composed of TiCN, and the combined C content ratio and N content ratio is a value within the above described range so that it possible to provide the decorative article 1A surface side with superior hardness, and to ensure that the decorative article 1A is not susceptible to cuts, scratches, and other such indentations or the like. Also, the second coat 4 is composed of stainless steel. It is thus possible to provide it in a reasonable price compared to the conventional platinum, palladium, and indium. Also, the stainless steel has higher brightness compared to the conventional titanium so that it is not limited to a target of use and it can be applied to the exterior components for timepiece which are required for excellent aesthetic appearance. In addition, the first coat is TiCN, in which the combined C content ratio and N content ratio is a value within the above described range, and the second coat is stainless steel. A color tone (chromaticity) of TiCN and a color tone (chromaticity) of stainless steel are relatively similar (difference is small) so that even if the stainless steel is rubbed or stripped off due to extensive use of the decorative article, adverse effects to the aesthetic appearance of the decorative article can be minimized. Because of this, the decorative article that enable to maintain excellent aesthetic appearance over a long period of time, with a reasonable price, and has a moderate brightness, can be provided.

(2) The C content ratio in the first coat 3 is a value within the above described range so that the decorative article 1A surface side is ensured to have sufficient hardness, and the color tone (chromaticity) of the first coat 3 can be optimized.

(3) The N content ratio in the first coat 3 is a value within the above described range so that the decorative article 1A surface side is ensured to have sufficient hardness, and the color tone (chromaticity) of the first coat 3 can be optimized.

(4) The C content ratio in the first coat 3 is higher than the N content ratio in the first coat 3 so that the color tone (chromaticity) of the first coat 3 can be optimized and the aesthetics appearance can be particularly excellent.

(5) The average thickness of the first coat is a value within the above described range so that the hardness of the first coat 3 is sufficiently high, and it is possible to effectively prevent the internal stress in the first coat 3 from increasing. Because of this, it possible to ensure that the decorative article 1A is not susceptible to cuts, scratches, and other such indentations or the like.

(6) The average thickness of the second coat is a value within the above described range so that the hardness of decorative article 1A surface side is sufficiently high, and it is possible to ensure excellent aesthetic appearance in the decorative article 1A.

(7) Employing the vapor phase film forming method, specifically employing the ion plating, as forming the first coat 3 makes it possible to ensure that variation in the film thickness will be low so that the first coat 3 is reliably formed with uniform thickness, and has particularly superior adhesiveness with the substrate 2.

(8) Forming the second coat 4 by the ion plating makes it possible to ensure the superior adhesiveness of the second coat 4.

(9) The Vickers hardness Hv is a value within the above described range in the surface side that the second coat is provided. Thus, it is possible to maintain excellent aesthetic appearance as a decorative article 1A over a longer period of time.

(10) Employing the above decorative article to the exterior components for timepiece makes it possible to ensure excellent appearance required as the decorative article and to have durability as a practical article.

(11) Having the above decorative article makes it possible to provide a timepiece that maintains excellent aesthetics appearance over a longer period of time.

Second Embodiment

Figure 3:
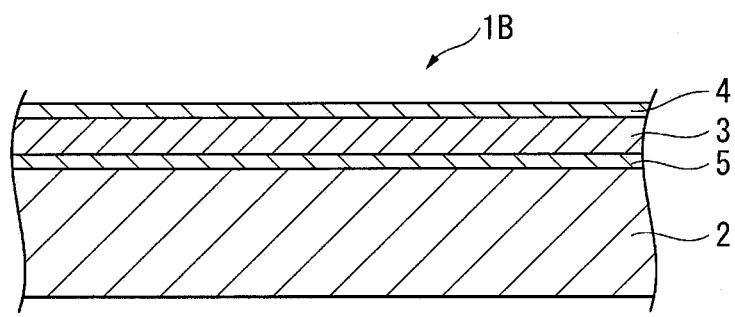
FIG. 3 is a cross-sectional view showing the second embodiment of a decorative article in the invention.

Next, the second embodiment of the decorative article of the invention, and the preferred embodiment of manufacturing method thereof will be described. FIG. 3 is a cross-sectional view showing the second embodiment of a decorative article in the invention. FIG. 4 is a cross-sectional view showing a preferred embodiment of a method for manufacturing the decorative article shown in FIG. 3. The description of the decorative article of the second embodiment and the manufacturing method thereof will focus on the differences with the embodiment previously described, and descriptions of similar matters will be omitted.

As shown in FIG. 3, the decorative article 1B of the present embodiment has a substrate 2, a foundation layer 5 provided on the surface of the substrate 2, a first coat 3 provided on the surface of the foundation layer 5, and a second coat 4 provided on the surface of the first coat 3. Specifically, other than having the foundation layer 5 between the substrate 2 and the first coat 3, the decorative article 1B is substantially identical to the decorative article 1A previously described. Therefore, the foundation layer 5 is described below.

Foundation Layer

The foundation layer 5 can have, for example, any of the following functions: a function of improving adhesiveness between the substrate 2 and the first coat 3 (a function as an adhesiveness improving layer), a function of repairing scratches in the substrate 2 by leveling (smoothing) (a function as a leveling layer), a function of dampening impact from external forces on the resulting decorative article (a function as a cushion layer), and the like.

Possible examples of the constituent material of the foundation layer 5 include Ti, Zr, Hf, V, Nb, Ta, Cr, Al, alloys containing at least one of these elements, and other such metal materials or the like. However, among these elements, Ti is preferred. If the foundation layer 5 is primarily composed of Ti, for example, adhesiveness between the substrate 2 and the first coat 3 can be further improved, and the decorative article 1B can be ensured to have particularly superior reliability and durability. Further, if the foundation layer 5 is primarily composed of Ti, its function as a leveling layer to alleviate irregularities in the surface of the substrate 2 is more profoundly performed. Moreover, if the foundation layer 5 is primarily composed of Ti, the foundation layer 5 functions more effectively as a cushion layer to dampen impact from external sources. As a result, the decorative article 1B is less susceptible to cuts and other such indentations. The average thickness of the foundation layer 5 is not particularly limited, but is preferably equal to or more than 0.1 µm and less than or equal to 2.0 µm, and is more preferably equal to or more than 0.5 and less than or equal to 1.0 µm. If the average thickness of the foundation layer 5 is a value within this range, the internal stress in the foundation layer 5 can be sufficiently prevented from increasing, and the functions of the foundation layer 5 described above can be more effectively performed.

Next, the method for manufacturing the decorative article 1B described above will be described. FIGS. 4A-4D are cross-sectional views showing a preferred embodiment of the method for manufacturing the decorative article shown in FIG. 3. The manufacturing method of the decorative article of the present embodiment has a step (FIG. 4B) for forming the foundation layer 5 on at least part of the surface of the substrate 2 (FIG. 4A), the first step (FIG. 4C) for forming the first coat 3 on at least part of the surface of the foundation layer 5, and the second step (FIG. 4D) for forming the second coat 4 on at least part of the surface of the first coat 3. That is, this process is identical to that of the embodiment previously described, except that the foundation layer 5 is formed prior to the formation of the first coat 3.

Foundation Layer Formation Step

Figure 4A:
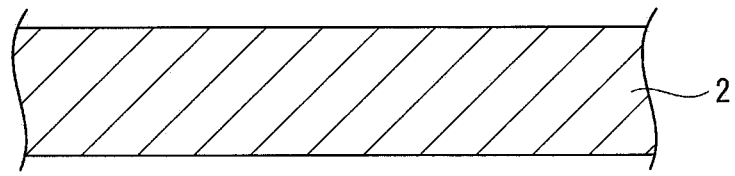
FIGS. 4A-4D are cross-sectional views showing a preferred embodiment of a method for manufacturing the decorative article shown in FIG. 3.
Figure 4B:
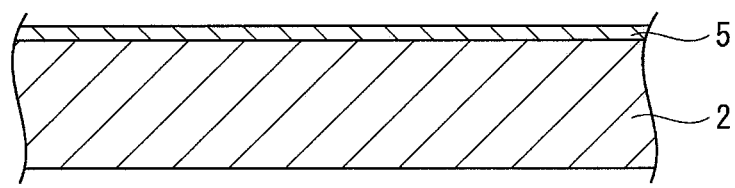
Figure 4C:
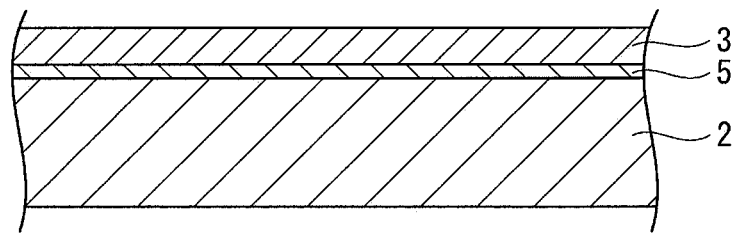
Figure 4D:
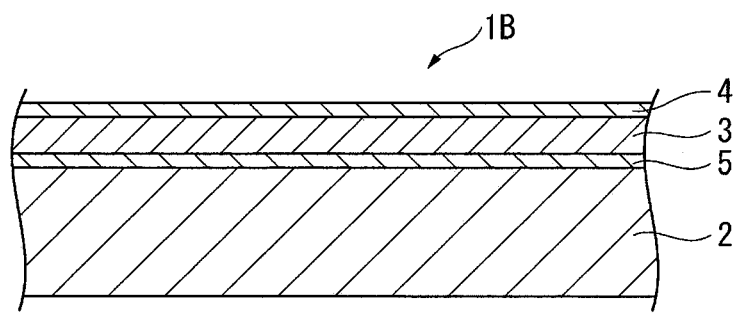

In the present embodiment, the foundation layer 5 is formed on the surface of the substrate 2 (FIG. 4B). The method for forming the foundation layer 5 is not particularly limited, and possible examples include: spin coating, dipping, paint coating, spray coating, electrostatic coating, electrodeposition coating, and other such coating methods; electrolytic plating, immersion plating, electroless plating, and other such wet plating methods; heat CVD, plasma CVD, laser CVD, and other such chemical vapor deposition methods (CVD); vacuum deposition, sputtering, ion plating, and other such dry plating methods (vapor phase film forming methods); and thermal spraying, and the like. However, a dry plating method (vapor phase film forming method) is preferred. Applying a dry plating method (vapor phase film forming method) as the method for forming the foundation layer 5 makes it possible to form reliably a foundation layer 5 that has uniform thickness, is homogeneous, and has particularly superior adhesiveness with the substrate 2. As a result, the finally resulting decorative article 1B can be ensured to have a particularly excellent aesthetic appearance and durability. Applying a dry plating method (vapor phase film forming method) as the method for forming the foundation layer 5 also makes it possible to ensure that variation in the film thickness will be sufficiently low even if the foundation layer 5 to be formed is relatively thin. This is advantageous in terms of improving the reliability of the decorative article 1B.

Also, when the first step described above is performed with a dry plating method, for example, in the same apparatus, the foundation layer formation step and the first step can be performed successively without removing the substrate 2 from the apparatus by varying the type of the target and the composition of the atmospheric gas (for example, the blend ratio between Ar gas or another such inert gas as well as nitrogen gas and a hydrocarbon gas) in the chamber of the vapor phase film forming apparatus. This results in particular superior adhesiveness between the substrate 2, the foundation layer 5, and the first coat 3, and the productivity of the decorative article 1B is improved. Further, in particular when the foundation layer 5 is composed of Ti, the foundation layer 5 and the first coat 3 can be formed successively by varying the composition of the atmospheric gas in the chamber of the vapor phase film forming apparatus using the same target.

Functional Effect of Second Embodiment

According to the decorative article of the second embodiment, in addition to the same effect obtained in the above described first embodiment, the following functional effects can be achieved. According to this invention, providing the foundation layer 5 between the substrate 2 and the first coat 3 makes it possible to ensure superior adhesiveness and superior reliability of the decorative article 1B. For example, when the foundation layer 5 has the function as the adhesiveness improving layer, it is possible to improve the adhesiveness between the substrate 2 and the first coat 3. Further, when the foundation layer 5 has the function as the leveling layer, it is possible to level and remove scratches by the leveling layer even if the substrate 2 had scratches. Moreover, when the foundation layer 5 has the function as the cushion layer, the cushion layer dampens impact from external forces so that it is not susceptible to scratches, and other such indentations or the like.

Another Embodiment

The invention is not limited to the above described embodiment, and the modification, the change, or the like can be possible in a scope that achieves the advantage of the invention. For example, a step that can have any suitable purpose can be added as necessary to the method for manufacturing the decorative article of the invention. For example, cleaning or another such intermediate process can be performed between the first step and the second step. Further, the substrate can be subjected to cutting, grinding, polishing, honing, or another such pretreatment.

Further, a coating layer (protective layer) to provide corrosion resistance, weather resistance, water resistance, oil resistance, scratching resistance, abrasion resistance, discoloration resistance, and the like and improving rust prevention, stain prevention, clouding prevention, scratching prevention, and other such effects can be formed on at least part of the surface of the decorative article. Such a coating layer can be designed to be removed when the decorative article is used. Moreover, in the embodiments previously described, the first coat and the second coat were described as being provided adjacent to each other, but at least one middle layer can also be provided between the first coat and the second coat. Adhesiveness between the first coat and the second coat can thereby be further improved, for example.

Working Examples

Specific working examples of the invention will next be described.

1. Manufacture of Decorative Article

Working Example 1

A decorative article (a back cover of the exterior case of the wristwatch) was manufactured by a method such as the one described below. First, a substrate having the shape of the back cover of the exterior case of the wristwatch was fabricated by casting using stainless steel (SUS 444), and the required location was then cut and polished.

The substrate was then cleaned by first performing alkali electrolytic degreasing for 30 seconds, and then performing alkali immersion degreasing for 30 seconds. Neutralization for 10 seconds, water rinsing for 10 seconds, and rinsing with purified water for 10 seconds were then performed. A first coat primarily composed of TiCN was formed according to the method below using an ion plating apparatus on the substrate cleaned as described above.

First, while the inside of the treatment chamber of the ion plating apparatus was pre-heated, the inside of the treatment chamber was depressurized (the pressure thereof was reduced) to $2 \times 10^{-3}$ Pa. Nitrogen gas and acetylene gas were then respectively introduced at flow rates of 15 mL/min and 20 mL/min, and the atmospheric pressure (total pressure) inside the treatment chamber was brought to $3.0 \times 10^{-3}$ Pa. In such a state (as nitrogen gas and acetylene gas continued to be introduced), using Ti as a target, the ionization voltage was set to 50V, the ionization current was set to 40 A, and vapor-phase film forming (ion plating) was performed for 60 minutes in this state (first step). As a result, a first coat 3 composed of TiCN having an average thickness of 1.0 µm was formed. The C content ratio in the first coat 3 thus formed was 7.3 wt %, and the N content ratio thereof was 3.7 wt %. The thickness of the first coat 3 was measured by the microscopical examination of cross sections according to JIS H 5821. After that, the second coat composed of stainless steel is formed on the surface of the first coat by using the sputtering apparatus (second step). The second coat 4 was formed according to the method described below.

First, while the inside of the treatment chamber of the sputtering apparatus was preheated, the inside of the treatment chamber was depressurized (the pressure thereof was reduced) to $2\times10^{-3}$ Pa. After that, argon gas was introduced at flow rates of 100 mL/min, and the atmospheric pressure (total pressure) inside the treatment chamber was brought to $5.0\times10^{-3}$ Pa. In such a state (argon gas continued to be introduced), using SUS316 as a target, the input voltage was set to 1400 W, and vapor-phase film forming (sputtering) was performed for 3 minutes (second step). As a result, the second coat composed on SUS316 having an average thickness of 0.1 µm was formed. By the way, the thickness of the first coat and the second coat were measured in accordance with the microscopical examination of cross sections according to JIS H 5821.

Working Examples 2 Through 4

By changing the flow rates of nitrogen gas and acetylene gas in the first coat, the treatment time of the first coat, the treatment time of the second coat, the decorative article was produced in the same manner as Working Example 1 except that the average thickness of the first coat, the C content ratio, the N content ratio, and the average thickness of the second coat were set as shown in Table 1.

Working Examples 5 Through 8

As a substrate, the decorative article was produced in the same manner as Working Examples 1 to 4 except that the substrate composed of Ti was used. As a substrate, a substrate molded by the metal powder injection molding (MIM) method as discussed below was used.

First, Ti powder having an average particle size of 52 µm manufactured by gas atomization was prepared. A mixture of raw materials composed of 75 vol % of this Ti powder, 8 vol % of polyethylene, 7 vol % of polypropylene, and 10 vol % of paraffin wax was kneaded. A kneader was used to knead the raw materials. The temperature of the raw materials during kneading was 60° C. The kneaded mixture thus obtained was pulverized and fractionated, and pellets with an average particle size of 3 mm were obtained. Metal powder injection molding (MIM) was performed by an injection molding machine using these pellets, and a molded article having the shape of the back cover of the exterior case of a wristwatch was manufactured. The molded article at this time was molded with consideration for shrinkage during binder removal and sintering. The molding conditions at the time of injection molding were as follows. Die temperature: 40° C.; injection pressure: 80 kgf/cm$^2$; injection time: 20 s; cooling time: 40 s.

The binder was then removed from the molded article in a degreasing oven, and a degreased article was obtained. The binder was removed for one hour in an argon gas atmosphere at $1.0\times10^{-1}$ Pa and 80° C., and the temperature was then increased to 400° C. at a temperature increase rate of 10° C./hour. The weight of the sample during heat treatment was measured, and binder removal was considered to be completed at the time at which there was no more weight decrease in the sample. Sintering was then performed using a sintering oven for the degreased article thus obtained, and a substrate 2 was obtained. Sintering was performed by heat-treating the sample for six hours at 900 to 1,100° C. in an argon gas atmosphere at a pressure of $1.3\times10^{-3}$ Pa to $1.3\times10^{-4}$ Pa. The substrate thus obtained was cleaned after being cut and polished in the necessary locations. The substrate was cleaned by first performing alkali electrolytic degreasing for 30 seconds, and then performing alkali immersion degreasing for 30 seconds. Neutralization for 10 seconds, water rinsing for 10 seconds, and rinsing with purified water for 10 seconds were then performed.

Comparative Example 1

First, in the same manner as the first embodiment described above, the first coat was formed on the surface of the substrate. The second coat primarily composed of Pt was then formed on the surface of the first coat by using the ion plating apparatus described above. The second coat formation was performed as follows. While the inside of the treatment chamber of the ion plating apparatus was preheated, the treatment chamber was first depressurized (the pressure was reduced) to $2\times10^{-3}$ Pa. Argon gas was then introduced at flow rates of 100 mL/min, and the atmospheric pressure inside the treatment chamber was brought to $5.0\times10^{-3}$ Pa. In such a state (argon gas continued to be introduced), using Pt as a target, the input voltage was set to 30V, the ionization current to 20 A, and vapor-phase film forming (ion plating) was performed for 10 minutes (second step). As a result, the second coat composed on Pt having an average thickness of 0.3 µm was formed.

Comparative Examples 2 and 3

By changing the flow rates of nitrogen gas and acetylene gas in the first coat, the treatment time of the first coat, the target composition used in the second coat, the treatment time of the second coat, the decorative articles (the back cover of the exterior case of a wristwatch) were manufactured in the same manner as Working Example 5 except that the average thickness of the first coat, the C content ratio, the N content ratio, and the average thickness of the second coat were set as shown in Table 1.

Working Examples 9 Through 12

The decorative articles were manufactured in the same manner as Working Examples 1 through 4 except that the foundation layer was formed on the substrate prior to the first coat formation. The foundation layer formation was performed as follows. The substrate was first cleaned in the same manner as Working Example 1, and the substrate was introduced into the inside of the chamber of the ion plating apparatus.

Next, while the inside of the treatment chamber of the ion plating apparatus was preheated, the treatment chamber was depressurized (the pressure was reduced) to $3\times10^{-3}$ Pa. Argon gas for cleaning was then introduced and the cleaning treatment was performed for 5 minutes. The cleaning treatment was performed by applying a direct-current voltage of 350V. After that, argon gas was introduced in the treatment chamber and a direct current 400V was applied. It was maintained for 30 to 60 minutes. In such a state, using Ti as a target, the ionization voltage to 30V, the ionization current to 20 A, and the treatment time for 20 minutes were set so that the foundation layer composed of Ti was formed (foundation layer formation step). As a result, the foundation layer having an average thickness of 0.5 µm was formed.

Working Examples 13 Through 16

The decorative articles were manufactured in the same manner as Working Examples 9 through 12 except that the substrate composed of Ti was used. The substrates manufactured by the same method and the same conditions as described in Working Examples 5 through 8 were used.

Comparative Examples 4 Through 6

The decorative articles were manufactured in the same manner as Comparative Examples 1 through 3 except that the foundation layer was formed on the surface of the substrate prior to the first coat formation. The foundation layers manufactured by the same method and the same conditions as described in Working Examples 9 through 12 were used.

The configurations of the decorative articles in the respective working examples and comparative examples are shown together in Tables 1 and 2. In Tables 1 and 2, the second coat in the respective working examples and comparative examples had a purity of 99.9 wt % or above, and was composed of the materials shown in Tables 1 and 2.

TABLE 1

|  | Substrate Constituent Material | Foundation layer | | First Film Coating (TiCN) | | | Second Film Coating | |
|---|---|---|---|---|---|---|---|---|
|  |  | Constituent Material | Average Thickness [μm] | C Content Ratio [wt %] | N Content Ratio [wt %] | Average Thickness [μm] | Constituent Material | Average Thickness [μm] |
| Working Example 1 | SUS444 | — | — | 7.3 | 3.7 | 1.0 | SUS316L | 0.1 |
| Working Example 2 | SUS444 | — | — | 9.0 | 8.0 | 2.0 | SUS316L | 0.2 |
| Working Example 3 | SUS444 | — | — | 1.5 | 1.0 | 3.0 | SUS316L | 0.5 |
| Working Example 4 | SUS444 | — | — | 10.0 | 2.0 | 2.5 | SUS316L | 0.9 |
| Working Example 5 | Ti | — | — | 7.3 | 3.7 | 1.0 | SUS316L | 0.1 |
| Working Example 6 | Ti | — | — | 9.0 | 8.0 | 2.0 | SUS316L | 0.2 |
| Working Example 7 | Ti | — | — | 1.5 | 1.0 | 3.0 | SUS316L | 0.5 |
| Working Example 8 | Ti | — | — | 10.0 | 2.0 | 2.5 | SUS316L | 0.9 |
| Comparative Example 1 | Ti | — | — | 7.3 | 3.7 | 1.0 | Pt | 0.3 |
| Comparative Example 2 | Ti | — | — | 8.0 | 5.0 | 2.0 | Pd—In (Pd: 97.0 wt %, In: 3.0 wt %) | 0.2 |
| Comparative Example 3 | Ti | — | — | 2.5 | 1.0 | 3.0 | Ti | 0.9 |

TABLE 2

|  | Substrate Constituent Material | Foundation layer | | First Film Coating (TiCN) | | | Second Film Coating | |
|---|---|---|---|---|---|---|---|---|
|  |  | Constituent Material | Average Thickness [μm] | C Content Ratio [wt %] | N Content Ratio [wt %] | Average Thickness [μm] | Constituent Material | Average Thickness [μm] |
| Working Example 9 | SUS444 | Ti | 0.5 | 7.3 | 3.7 | 1.0 | SUS316L | 0.1 |
| Working Example 10 | SUS444 | Ti | 0.5 | 9.0 | 8.0 | 2.0 | SUS316L | 0.2 |
| Working Example 11 | SUS444 | Ti | 0.5 | 1.5 | 1.0 | 3.0 | SUS316L | 0.5 |
| Working Example 12 | SUS444 | Ti | 0.5 | 10.0 | 2.0 | 2.5 | SUS316L | 0.9 |
| Working Example 13 | Ti | Ti | 0.5 | 7.3 | 3.7 | 1.0 | SUS316L | 0.1 |
| Working Example 14 | Ti | Ti | 0.5 | 9.0 | 8.0 | 2.0 | SUS316L | 0.2 |
| Working Example 15 | Ti | Ti | 0.5 | 1.5 | 1.0 | 3.0 | SUS316L | 0.5 |
| Working Example 16 | Ti | Ti | 0.5 | 10.0 | 2.0 | 2.5 | SUS316L | 0.9 |
| Comparative Example 4 | Ti | Ti | 0.5 | 7.3 | 3.7 | 1.0 | Pt | 0.3 |
| Comparative Example 5 | Ti | Ti | 0.5 | 8.0 | 5.0 | 2.0 | Pd—In (Pd: 97.0 wt %, In: 3. Wt %) | 0.2 |
| Comparative Example 6 | Ti | Ti | 0.5 | 2.5 | 1.0 | 3.0 | Ti | 0.9 |

2. Appearance Evaluation

The decorative articles manufactured in the respective working examples and comparative examples were observed with the naked eye and with a microscope, and these appearances were evaluated according to the following four standards.

⊚: Excellent appearance
○: Good appearance
Δ: Fair appearance
X: Poor appearance

3. Abrasion Resistance Evaluation

For the respective decorative articles manufactured in the above respective working examples and comparative examples, their abrasion resistances were evaluated. By using Bayer Testing Machine made by COLTS Laboratories, the surfaces on the side of the respective decorative articles on which the coats were formed were subjected to abrasion by reciprocating 500 times a media of mass 500 g, and the conditions of the scratches on the surfaces were evaluated. By the way, zircon-based particles were used for the media.

⊚: No cuts observed in the surface of the coat
○: Few cuts observed in the surfaces of the coat
Δ: Fair amount of cuts observed in the surface of the coat
X: Numerous cuts observed in the surface of the coat

4. Scratching Resistance (Resistance to Scratches) Evaluation

For the respective decorative articles manufactured in the respective working examples and comparative examples, scratching resistances were evaluated by conducting the tests as follows. A stainless steel ball (1 cm in diameter) was dropped from a height of 50 cm onto the surfaces of the respective decorative articles on the side on which the coat was formed, and the size of the indentations (diameter of the indentations) in the decorative article surfaces were measured and evaluated according to the following four standards.

⊚: Diameter of indentation was less than 1 mm, or no indentation was observed
○: Diameter of indentation was 1 mm or greater and less than 2 mm
Δ: Diameter of indentation was 2 mm or greater and less than 3 mm
X: Diameter of indentation was 3 mm or greater

5. Removal of Coat with Reagents and Re-Forming of Coat

In the decorative articles manufactured in the respective Working Examples and Comparative Examples, the coats were removed with reagents, and the coats were re-formed under conditions similar to those in the corresponding respective Working Examples and Comparative Examples. The ease of removing the coats (first coat and second coat) and re-forming the coats were evaluated according to the following four standards.

⊚: The coats could be easily and reliably removed with reagents and re-formed, and the appearance of the decorative article on which the coats were re-formed was similar to that of the coats that were removed with reagents.

○: Removing the coats with reagents and re-forming the coats were somewhat difficult, but the appearance of the decorative article on which the coats were re-formed was substantially similar to that of the coats that were removed with reagents. Alternatively, removing the coats with reagents and re-forming the coats were easy, but the appearance of the decorative article on which the coats were re-formed was somewhat inferior to that of the coats that were removed with reagents.

Δ: Removing the coats with reagents and re-forming the coats were somewhat difficult, and the appearance of the decorative article on which the coats were re-formed was somewhat inferior to that of the coats that were removed with reagents.

X: Removing the coats with reagents and re-forming the coats were substantially impossible, and/or the appearance of the decorative article on which the coats were re-formed was drastically inferior to that of the coats that were removed with reagents. For the method of removing the coats, an aqueous solution containing 15 vol % of nitric acid ($HNO_3$) and 15 vol % of sulfuric acid ($H_2SO_4$) was used as the chemical, and the decorative articles were immersed in this aqueous solution.

For the decorative articles wherein the coats could not be removed by reagents, an attempt was made to remove the coats by grinding, polishing, or another such mechanical method. As a result, although the coats could be removed, the substrate was scratched. Then, when the coats were re-formed under the same conditions on the decorative articles from which the coats had been removed, the aesthetic appearance of the resulting decorative articles was drastically reduced due to the effects of the scratches on the substrate. These results are shown in Tables 3 and 4, respectively, along with the Vickers hardness Hv of the coats. The Vickers hardness Hv denotes a value measured under a load of 10 gf in the surfaces of the respective decorative articles (the surfaces of the side to which the second coats were provided).

6. Brightness

For the decorative articles manufactured in the above respective Working Examples and Comparative Examples, the brightness* was measured in accordance with the color coordinate system L*a*b* by using a spectrophotometer (Konica Minolta; CM-5). Here, the color display in accordance with the color coordinate system L*a*b* denotes the color display method standardized with JIS Z8729. A value of L* denotes brightness, and values of a* and b* denote chromaticity showing color phase and saturation.

TABLE 3

|  | Appearance Evaluation | Abrasion Resistance Evaluation | Scratching Resistance Evaluation | Re-forming of Coat | Vickers hardness | Brightness L* |
|---|---|---|---|---|---|---|
| Working Example 1 | ⊚ | ○ | ○ | ⊚ | 650 | 82.5 |
| Working Example 2 | ⊚ | ⊚ | ⊚ | ⊚ | 1000 | 81.0 |

TABLE 3-continued

| | Appearance Evaluation | Abrasion Resistance Evaluation | Scratching Resistance Evaluation | Re-forming of Coat | Vickers hardness | Brightness L* |
|---|---|---|---|---|---|---|
| Working Example 3 | ◎ | ○ | ○ | ◎ | 630 | 83.0 |
| Working Example 4 | ◎ | ◎ | ◎ | ◎ | 900 | 81.5 |
| Working Example 5 | ○ | ○ | ○ | ○ | 620 | 82.5 |
| Working Example 6 | ○ | ◎ | ◎ | ○ | 930 | 81.0 |
| Working Example 7 | ◎ | ○ | ○ | ○ | 610 | 83.0 |
| Working Example 8 | ◎ | ◎ | ◎ | ○ | 840 | 81.5 |
| Comparative Example 1 | ◎ | ○ | ○ | ○ | 620 | 88.5 |
| Comparative Example 2 | ◎ | ◎ | ◎ | ○ | 960 | 86.0 |
| Comparative Example 3 | △ | ○ | △ | ○ | 640 | 78.0 |

TABLE 4

| | Appearance Evaluation | Abrasion Resistance Evaluation | Scratching Resistance Evaluation | Re-forming of Coat | Vickers hardness | Brightness L* |
|---|---|---|---|---|---|---|
| Working Example 9 | ◎ | ○ | ◎ | ◎ | 680 | 82.5 |
| Working Example 10 | ◎ | ◎ | ◎ | ◎ | 1000 | 81.0 |
| Working Example 11 | ◎ | ○ | ◎ | ◎ | 660 | 83.0 |
| Working Example 12 | ◎ | ◎ | ◎ | ◎ | 900 | 81.5 |
| Working Example 13 | ◎ | ○ | ◎ | ○ | 640 | 82.5 |
| Working Example 14 | ◎ | ◎ | ◎ | ○ | 940 | 81.0 |
| Working Example 15 | ◎ | ○ | ◎ | ○ | 620 | 83.0 |
| Working Example 16 | ◎ | ◎ | ◎ | ○ | 850 | 81.5 |
| Comparative Example 4 | ◎ | ○ | ○ | ○ | 630 | 88.5 |
| Comparative Example 5 | ◎ | ◎ | ◎ | ○ | 980 | 86.0 |
| Comparative Example 6 | △ | ○ | △ | ○ | 650 | 78.0 |

As is made clear from Tables 3 and 4, the decorative articles of the invention all had moderate brightness and excellent aesthetic appearances. Further, the decorative articles of the invention had high hardness in the surface side thereof and superior abrasion resistance and scratching resistance. Moreover, those wherein the C and N content ratios in the first coat and the thickness of the coats (first coat, second coat, foundation layer) were values within the preferred ranges had particularly superior results. Even further, the respective decorative articles of the invention had a superior feel without any grainy feel.

In the invention, coats (first coat, second coat, foundation layer) with the desired compositions and characteristics could be easily formed by appropriately selecting the atmospheric components during ion plating. The decorative articles of the invention had superior durability, the coats could be easily and reliably removed by using special reagents, and the coats could be suitably re-formed.

What is claimed is:

1. A decorative article comprising:
   a substrate being primarily composed of at least any of Ti and stainless steel in at least part of a surface vicinity thereof;
   a first coat being formed on the substrate and being primarily composed of TiCN;
   a second coat being formed on a side of the first coat opposite a side facing the substrate and being composed of stainless steel;
   wherein a combined C content and N content in the first coat is equal to or more than 2.0 wt % and less than or equal to 19 wt %, and
   the C content in the first coat is higher than the N content in the first coat.

2. The decorative article according to claim 1, wherein the C content in the first coat is equal to or more than 1 wt % and less than or equal to 10 wt %.

3. The decorative article according to claim 1, wherein the N content in the first coat is equal to or more than 0.5 wt % and less than or equal to 10 wt %.

4. The decorative article according to claim 1, wherein an average thickness of the first coat is equal to or more than 1.0 μm and less than or equal to 3.0 μm.

5. The decorative article according to claim 1, wherein an average thickness of the second coat is equal to or more than 0.1 μm and less than or equal to 1.0 μm.

6. The decorative article according to claim 1, wherein the first coat is formed by a vapor phase film forming method.

7. The decorative article according to claim 6, wherein the vapor phase film forming method is ion plating.

8. The decorative article according to claim 1, wherein the second coat is formed by sputtering.

9. The decorative article according to claim 1, wherein at least one foundation layer is formed between the substrate and the first coat.

10. The decorative article according to claim 9, wherein a layer, which is primarily composed of Ti, is formed as the foundation layer.

11. The decorative article according to claim 9, wherein an average thickness of the foundation layer is equal to or more than 0.1 μm and less than or equal to 2.0 μm.

12. The decorative article according to claim 1, wherein a Vickers hardness Hv measured at a load of 10 gf is equal to or more than 600 and less than or equal to 1000 on a surface of a side on which the second coat is provided.

13. The decorative article according to claim 1, wherein the decorative article is an exterior component for a timepiece.

14. A timepiece comprising a decorative article according to claim 1.

* * * * *